(12) United States Patent
Tangyunyong et al.

(10) Patent No.: US 9,188,622 B1
(45) Date of Patent: Nov. 17, 2015

(54) POWER SPECTRUM ANALYSIS FOR DEFECT SCREENING IN INTEGRATED CIRCUIT DEVICES

(75) Inventors: Paiboon Tangyunyong, Albuquerque, NM (US); Edward I. Cole, Jr., Albuquerque, NM (US); David J. Stein, Seattle, WA (US)

(73) Assignee: Sandia Corporation, Albuquerque, NM (US)

( * ) Notice: Subject to any disclaimer, the term of this patent is extended or adjusted under 35 U.S.C. 154(b) by 723 days.

(21) Appl. No.: 13/309,281

(22) Filed: Dec. 1, 2011

(51) Int. Cl.
*G01R 31/26* (2014.01)
*G01R 27/28* (2006.01)

(52) U.S. Cl.
CPC .............. *G01R 31/26* (2013.01); *G01R 27/28* (2013.01)

(58) Field of Classification Search
CPC .............................. G01R 31/26; G01R 27/28
See application file for complete search history.

(56) References Cited

U.S. PATENT DOCUMENTS

| 5,430,305 | A | 7/1995 | Cole, Jr. et al. | |
| 6,058,502 | A * | 5/2000 | Sakaguchi | 714/811 |
| 6,078,183 | A | 6/2000 | Cole, Jr. | |
| 6,549,022 | B1 | 4/2003 | Cole, Jr. et al. | |
| 6,600,333 | B1 * | 7/2003 | Martin et al. | 324/750.3 |
| 6,671,153 | B1 * | 12/2003 | Ker et al. | 361/111 |
| 2001/0043079 | A1 * | 11/2001 | Sakaguchi | 324/765 |
| 2003/0016044 | A1 * | 1/2003 | Ishida et al. | 324/765 |

* cited by examiner

*Primary Examiner* — Jeff Natalini
(74) *Attorney, Agent, or Firm* — Martin I. Finston

(57) ABSTRACT

A device sample is screened for defects using its power spectrum in response to a dynamic stimulus. The device sample receives a time-varying electrical signal. The power spectrum of the device sample is measured at one of the pins of the device sample. A defect in the device sample can be identified based on results of comparing the power spectrum with one or more power spectra of the device that have a known defect status.

18 Claims, 7 Drawing Sheets

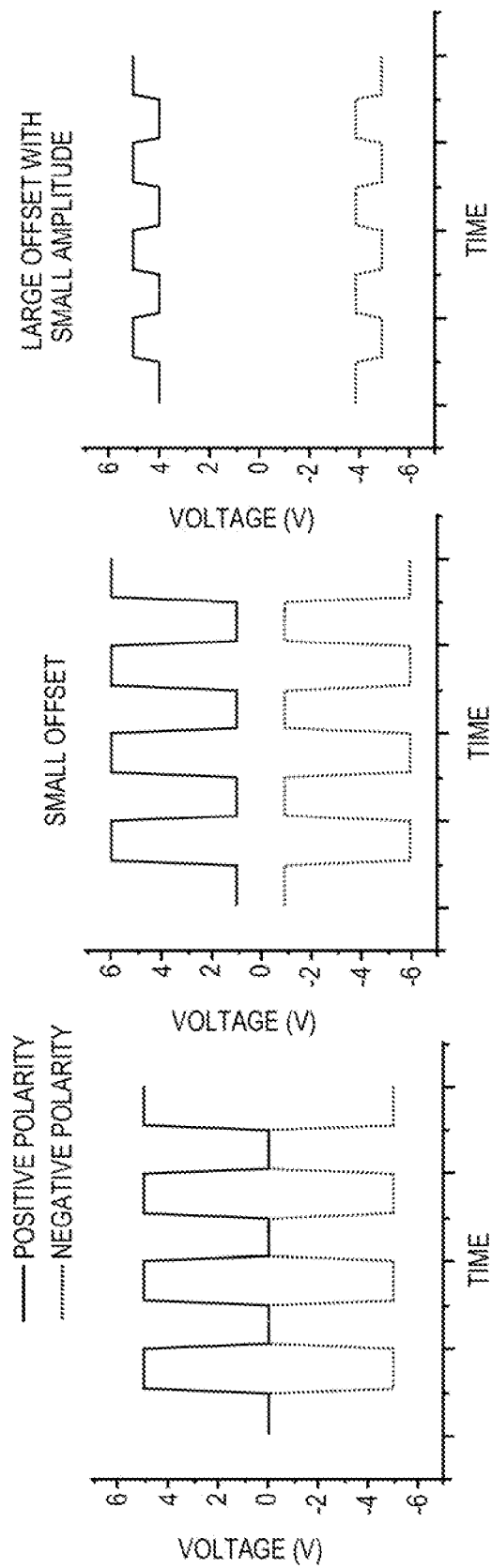

POWER SPECTRUM ANALYSIS FOR DEFECT SCREENING IN INTEGRATED CIRCUIT DEVICES

FEDERALLY SPONSORED RESEARCH

The United States Government has rights in this invention pursuant to Department of Energy Contract No. DE-AC04-94AL85000 with Sandia Corporation.

FIELD OF THE INVENTION

Device testing; and in particular, to the use of power spectrum for defect screening in integrated circuit devices.

BACKGROUND

An integrated circuit (IC) can have millions of transistors with a feature size less than a micron. Therefore, to identify a defect in an IC generally requires extensive failure analysis. In the past, various techniques based on electrical, optical, and thermal properties of ICs have been developed. However, these techniques are quite complex, time-consuming, and costly.

Further, an IC can contain a latent defect (also referred to as a "failure precursor") that is likely to develop into a defect after a period of use. Conventionally, these latent defects are detected by subjecting the IC to reliability testing, during which the device receives high voltage and/or high temperature for a period of time. Reliability testing can be quite time-consuming and can significantly increase the production cost.

Therefore, there is a need for a simple and efficient technique for screening ICs to identify the existence of defects.

SUMMARY

A method for defect screening in an integrated circuit device is disclosed. According to one embodiment of the method, a time-varying signal is supplied to a device sample. The power spectrum of the device sample is measured at one of the pins of the device sample. A defect in the device sample can be identified by comparing the power spectrum with one or more power spectra of the device that have a known defect status.

A system for defect screening in an integrated circuit device is also disclosed. According to one embodiment of the system, a signal generator supplies a time-varying signal to a device sample. A spectrum analyzer measures a power spectrum at one of the pins of the device sample. A computer system identifies an indication of a defect in the device sample based on results of comparing the power spectrum with one or more power spectra of the device that have a known defect status.

A computer product for defect screening in an integrated circuit device is also disclosed. According to one embodiment, a non-transitory computer readable storage medium including instructions that, when executed by a computer system, cause the computer system to receive a power spectrum of a device sample, and to identify an indication of a defect in the sample based on results of comparing the power spectrum with one or more power spectra of the device that have a known defect status. At least one of the pins of the device sample is coupled to a signal generator that supplies a time-varying electrical signal to the device sample. The power spectrum of the device sample is measured at one of the pins of the device sample.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

FIGS. 3A-3C illustrate examples of a periodic waveform that supplies a ripple voltage to a device sample.

DETAILED DESCRIPTION

Figure 1:
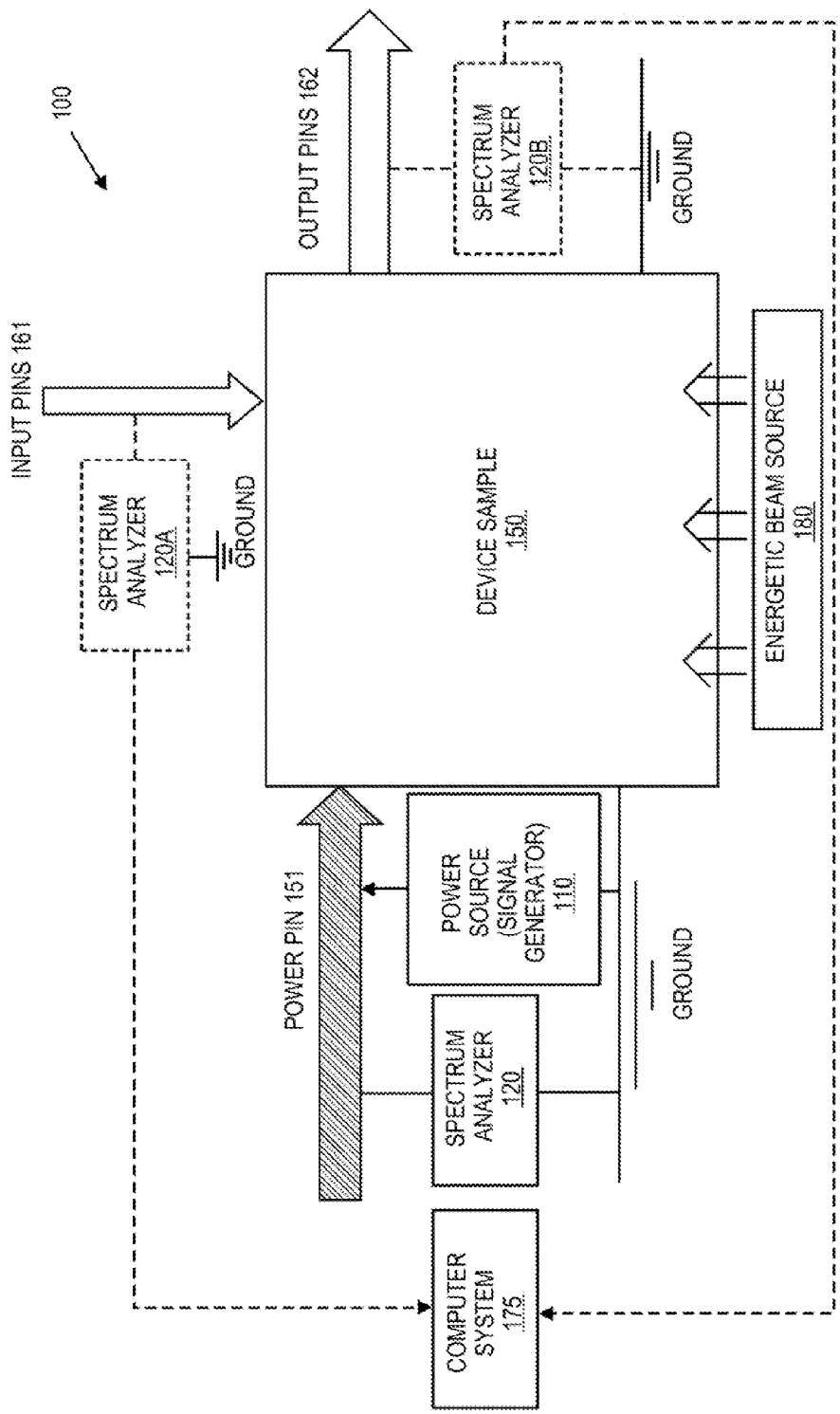
FIG. 1 is a block diagram illustrating an embodiment of a system that measures a power spectrum analysis (PSA) signature for a device sample.

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Power spectrum analysis (PSA) is a technique that indirectly measures the frequency response of a device when the device is subject to a dynamic stimulus. Devices with defects will have different frequency response than the devices with no defects. Conventional failure analysis techniques are effective only when defects produce an observable failure in a device with its electrical signatures (e.g. current Leakage or functionality) different from a "normal" device. With increasing complexity of modern devices, the electrical signatures of latent defects (also referred to "precursors") can be masked by the background electrical signals of normal operation, making detection of these defects extremely difficult. PSA has the potential to be more sensitive than conventional detection schemes and allows detection of latent defects (precursors). Latent defects have no other observable failure signatures, but can eventually cause failures after a period of normal operation and in some cases during storage. Latent defects can potentially pose a major reliability risk.

Embodiments of the invention utilize the power spectrum of an integrated circuit device (equivalently, "device") for detecting the existence of defects in the device. The power spectrum is measured while the device is receiving a dynamic stimulus. According to embodiments of the invention, the measured power spectrum indicates the existence of a defect and, in some scenarios, a specific type of defect. Therefore, the measured power spectrum can be used as a signature of the device for screening defects in the device. In the following description, the terms "power spectrum," "signature" and "power spectrum analysis (PSA) signature" are used interchangeably.

Embodiments of the invention provide a simple and efficient technique for screening defects in devices. In some embodiments, the defect screening technique compares the power spectra of two samples of the same device to determine whether a defect exists. For example, the power spectrum of a first device sample can be compared with the power spectrum of a second device sample that has a known defect status. A device sample has a "known defect status" means that the device sample either has no defect or has a known type of defect. Similarly, a power spectrum has a "known defect status" means that the power spectrum is generated from a device sample that either has no defect or has a known type of defect. If the second device sample has no defect, the differences between the power spectra of the first device sample and the second device sample indicate that the first device sample likely has some type of defect. In some embodiments, the defect screening technique establishes a database that contains the power spectra of devices with known defect status. The defect screening technique can derive rules from the features of these power spectra, and identify the existence of a defect or a known type of defect in a given device sample based on these rules.

The PSA spectra of devices with known defect status can be measured experimentally from physical device samples or generated from modeled device samples based on first principles with theoretical modeling. For example, a device can be modeled as a combination of resistors, capacitors and inductors. The power spectrum (i.e., the PSA signature) of the device in response to a given dynamic stimulus can be calculated (or simulated) based on known principles. The resulting PSA signatures, also referred to as model-generated PSA signatures, allow screening of defects in device samples, without requiring comparison to reference devices with a known defect status and the need of having a library of measured PSA signatures.

FIG. 1 is a block diagram illustrating a first embodiment of a system 100 for power spectrum analysis (PSA) measurement. In this embodiment, system 100 includes a power source 110 and a spectrum analyzer 120 coupled between a power pin 151 and the ground of a sample of a device (also referred to as "device sample" 150). In one embodiment, device sample 150 is a sample of an integrated circuit device. Device sample 150 can be in wafer form (i.e., with multiple other samples of the device on a common semiconductor substrate), in die form (i.e., separated from the wafer but not yet packaged), or in packaged form.

In the embodiment of FIG. 1, power source 110 is a signal generator that provides a dynamic (i.e., time-varying) stimulus to device sample 150 through its power pin 151. In one embodiment, the input to spectrum analyzer 120 is the same dynamic stimulus that feeds into power pin 151. The dynamic stimulus can be a periodic waveform of ripple voltage, such as sine-wave, square wave, chirp, or the like. As will be shown in the example of FIGS. 4A-4C, the waveform (as well as the power spectrum) of the ripple voltage measured at power pin 151 can change after power source 110 is connected to device sample 150.

Device sample 150 also has input pins 161 (including data inputs, clock inputs pins, test inputs such as Joint Test Action Group (JTAG) inputs, and any other input pins) and output pins 162. It is appreciated that the term "pins" herein is used equivalently to "lines," "wires," or "ports," and does not mean or imply that device sample 150 has a particular form (such as in wafer, die, or packaged form). Input pins 161 can be connected to the same signal source or different signal sources. Each input pin 161 can be floating (i.e., no voltage applied), biased with a constant voltage, or set to the same varying voltage as power pin 151. Input pins 161 may also be biased independently of the power pin 151. Some of the input pins, such as the one or more clock pins, can be biased with a switching voltage (e.g., a square wave) to maintain a known dynamic state. Each of output pins 162 can be left floating, or coupled with a load resistor as specified by the manufacturer.

In the embodiment of FIG. 1, when a dynamic stimulus is applied to power pin 151 of device sample 150, spectrum analyzer 120 measures its electrical response (which is a time-varying voltage signal). Specifically, spectrum analyzer 120 measures the response on power pin 151, calculates the real-time Fast Fourier Transform (FFT) of the response, and displays the frequency components (i.e., power spectrum) of the response. The display shows the amplitude of each frequency component. The amplitude can be shown in decibels (in log scale) such that non-dominant frequency components can be visible on the display. The power spectrum is a PSA signature of device sample 150.

In alternative embodiments, spectrum analyzer 120 can be connected to any of input pins 161 (including the one or more clock pins) or any of output pins 162 to measure the response of device sample 150 to the dynamic stimulus provided through power pin 151. These alternative placements of spectrum analyzer 120 are shown in FIG. 1 as spectrum analyzer 120A and spectrum analyzer 120B in dotted text boxes, and their connections to other components are shown in dotted lines. Each of these alternative placements of spectrum analyzer 120, 120A and 120B can produce the same or different PSA signatures of device sample 150 for defect screening purposes.

Figure 2:
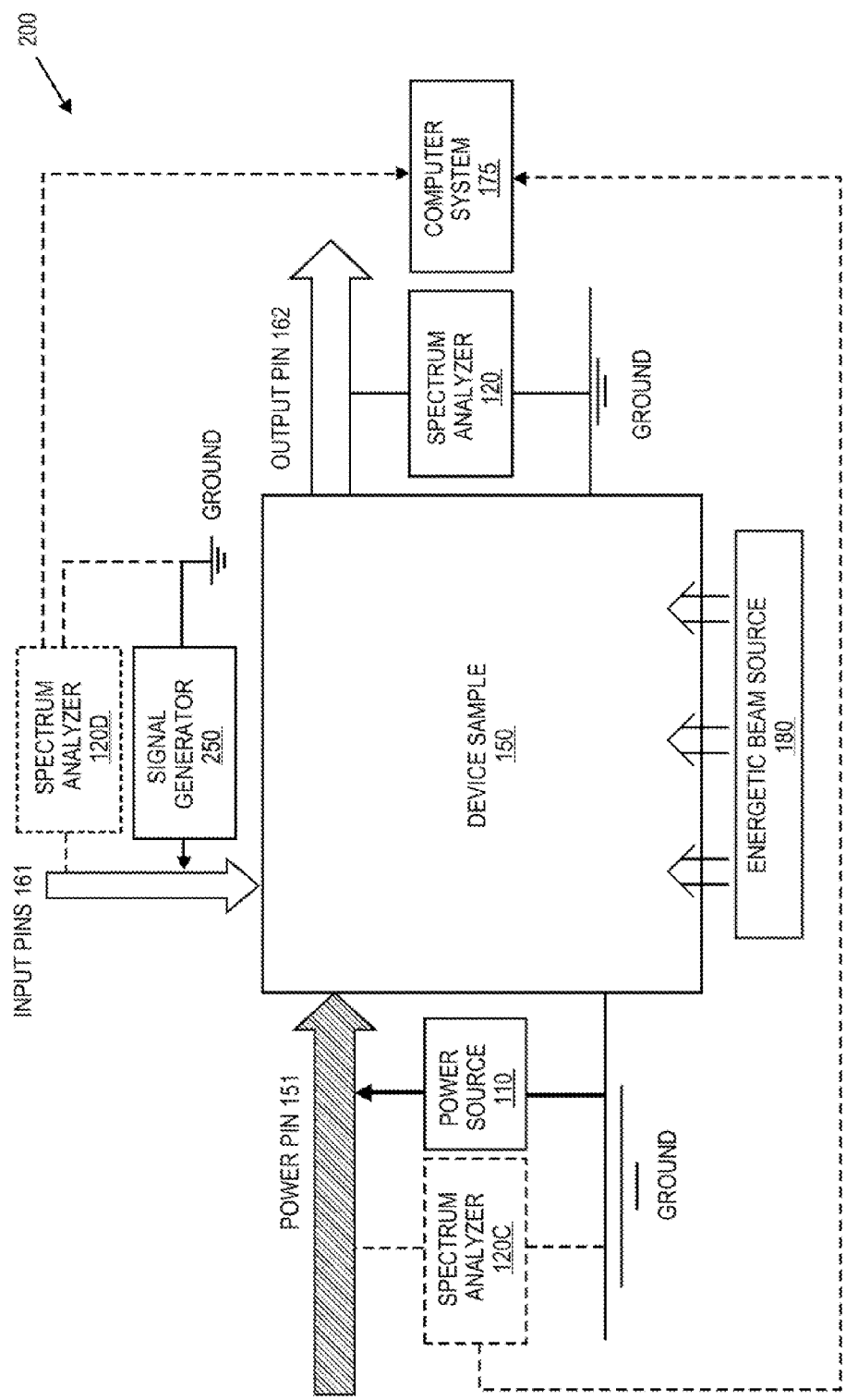
FIG. 2 is a block diagram illustrating another embodiment of a system that measures a PSA signature for a device sample.

FIG. 2 is a block diagram illustrating a second embodiment of a system 200 for power spectrum analysis (PSA) measurement. In this embodiment, the dynamic stimulus is provided to device sample 150 through at least one of input pins 161. Power source 110 provides voltage, normally constant voltage, to power pin 151, and at least one input pin 161 receives a dynamic stimulus from a signal generator 250. The dynamic stimulus can be a time-varying sequence of voltages (e.g., sine wave, square wave, or a sequence of logical lows and highs). The rest of input pin 161 can be either floating, biased with a constant voltage, or biased with a switching voltage to maintain a known dynamic biasing state. In some embodiments, signal generator 250 may be a vector generator that is coupled to multiple input pins 161 to supply the dynamic stimulus in the form of a sequence of test vectors (with each test vector being a vector of logical lows and highs). These test vectors can also be used for functional testing of device sample 150; that is, the test vectors can also be used to verify whether device sample 150 produces outputs in response to inputs as required by its manufacturer's specification.

As shown in FIG. 2, spectrum analyzer 120 can be coupled between any of output pins 162 and the ground to measure the response of device sample 150 to the dynamic stimulus injected into the one or more input pins 161. The measured response is also a PSA signature of device sample 150. In some embodiments, the dynamic stimulus can be provided to a combination of power pin 151 and one or more input pins 161, and spectrum analyzer 120 can measure the response via any of output pins 162 to obtain a PSA signature.

In alternative embodiments, spectrum analyzer 120 can be connected to power pin 151 or any of input pins 161 to measure the response of device sample 150 to the dynamic stimulus provided through the one or more input pins 161. These alternative placements of spectrum analyzer 120 are shown in FIG. 2 as spectrum analyzer 120C and spectrum analyzer 120D in dotted text boxes, and their connections to other components are shown in dotted lines. Each of these alternative placements of spectrum analyzer 120, 120C and 120D can produce the same or different PSA signatures of device sample 150 for defect screening purposes.

In the embodiments of FIG. 1 and FIG. 2, spectrum analyzer 120 (or any of spectrum analyzers 120A-D) is connected to a computer system 175. Computer system 175 can be a computer (e.g., a server, a workstation, a desktop, a laptop, or other computing devices) or other data processing devices. In one embodiment, computer system 175 receives PSA signatures of device samples and stores them in data storage with their associated defect status, such as defect or no defect, the type of defect (e.g., short circuit, open circuit, etc.), location of the defect, and the like. In one embodiment, the defect status can be obtained by performing a reliability test and/or other failure analysis on the device samples to see if any of them fails and the reason of failure. In one embodiment, the stored PSA signatures can be measured experimentally, generated based on theoretical modeling, or a combination of both. Based on the stored information, computer system 175 can determine whether a given device sample is defective or is likely to fail by correlating or comparing the PSA signature of the given device sample with the stored PSA signatures.

In some embodiments as shown in FIG. 1 and FIG. 2, device sample 150 can be exposed to an energetic beam source 180, which generates laser (photons), X-ray, ion beams or electron beams. These energetic beams enhance a device's PSA signature with respect to the peak locations, amplitudes, shapes and other distinctive properties of the power spectrum. As described above, PSA signatures can be used to differentiate a defective device sample from its non-defective counterparts, and among device samples having different types of defects. In some scenarios, the PSA signatures of these device samples may be quite similar and difficult to differentiate. The energetic beams can significantly enhance the differences between the PSA signatures of these devices. For example, a defective device sample can have more/less peak locations, higher/lower peak amplitudes, and/or different shapes than non-defective device samples. In some embodiments, the energetic beams can be used to accelerate the formation of defects if latent defects are hidden in a device sample. The energetic beams can be focused beams or flat (non-focused) beams, and can be applied to the device front side (device side) or the backside (substrate side) as long as there is sufficient energy and/or appropriate wavelength to penetrate the device layer. It is appreciated that some device samples and/or some defect types can have distinct PSA signatures without the use of energetic beams. For these devices and/or defect types, the use of energetic beams may not be necessary.

In some embodiments, the energetic beam source 180 can be a light source. Known techniques such as Light-Induced Voltage Alteration (LIVA) or Thermally-Induced Voltage Alteration (TIVA) can be used to alter the electrical properties of device sample 150, thereby enhancing its PSA signatures. A system implementing the LIVA technique uses a light source that irradiates and scans the surface of an integrated circuit with focused light. The focused light has photon energy near or above the bandgap energy of the semiconductor material of the integrated circuit. A system implementing the TWA technique uses a light source that irradiates and scans electrical conductors within an integrated circuit with focused light. The focused light has photon energy less than the bandgap energy of the semiconductor material of the integrated circuit. The LIVA and TIVA techniques are known in the art, and, therefore, are not described in detail herein.

In some embodiments, the energetic beams can be X-ray beams. X-ray beams can change the electrical properties of the gate oxide of a semiconductor transistor and result in a shift in the threshold voltage (Vth) of the transistor. In some embodiments, ion beams or electron beams can also be used as the energetic beams.

As described above, one form of the dynamic stimulus is ripple voltage. FIGS. 3A-3C illustrate some examples of the ripple voltage in the form of a periodic waveform (such as a square wave in these examples). The periodic waveform can have either positive polarity or negative polarity (FIG. 3A). The periodic waveform can have a constant offset bias added to it (FIG. 3B). Further, the amplitude of the periodic waveform can be full rail, i.e., from ground to the normal operating potential, or smaller than full rail. FIG. 3C shows a periodic waveform that has a smaller than a full-rail swing in amplitude and has a constant offset bias added to it. As an example, a device specified to operate at 3 volts can receive a power supply that varies from 0 to 3 volts, from 0 to 0.5 volts, from 2.8 to 3.0 volts, or other voltage ranges not exceeding the manufacturer's specified level. As described above, another form of the dynamic stimulus is a sequence of logical lows and logical highs. These logical lows and logical highs can also have a smaller amplitude than the operating level specified by the manufacturer, and/or have an offset added to them.

Figure 4A:
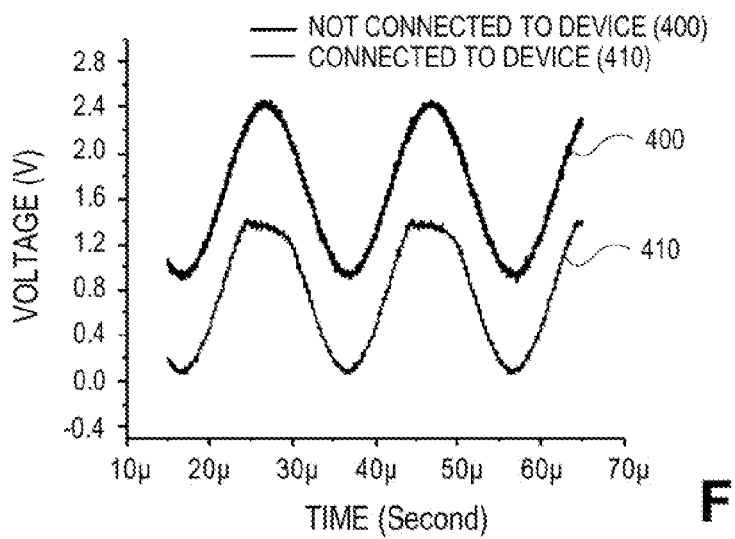
FIGS. 4A-4C illustrate an example of the changes measured at a power pin of a device when a power source is connected to the device.
Figure 4B:
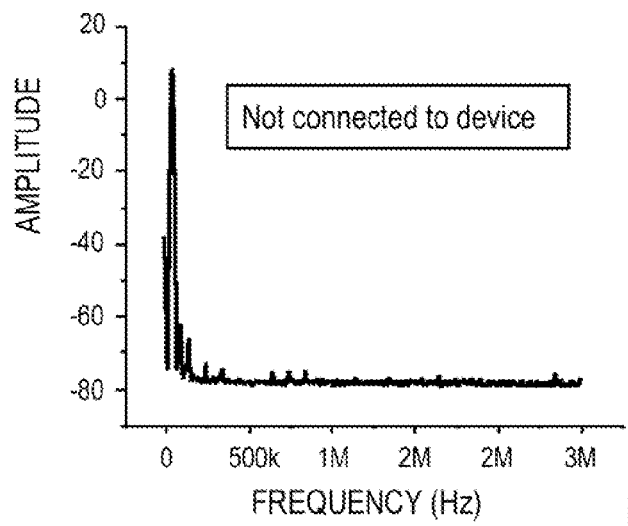
Figure 4C:
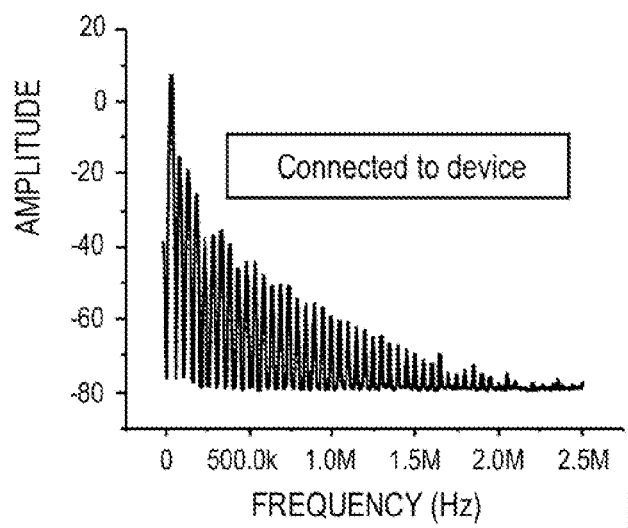

FIGS. 4A-4C illustrate an example of the changes measured at a power pin of a device when a power source is connected to the device. Referring to FIG. 4A, the time-domain waveform produced by a power source (e.g., power source 110 of FIG. 1) is a ripple voltage in the form of a sine wave 400. When power source 110 is not connected to device sample 150, the resulting output of spectrum analyzer 120 is shown in FIG. 4B. When power source 110 is connected to power pin 151 of device sample 150, the voltage measured at power pin 151 is a sine wave 410 that is slightly offset and slightly distorted when compared with sine wave 400. The resulting power spectrum measured at power pin 151 when device sample 150 is connected to power source 110 is shown in FIG. 4C. FIGS. 4A-4C show that loading a device to a power source can change the voltage output of the power source, and this change is more clearly visible in the frequency domain than in the time domain. Further, even though the power spectrum measurement is made at a pin that receives an undistorted sine wave (sine wave 400), the resulting power spectrum is different from the power spectrum of sine wave 400 and contains a unique characterization of the electrical property of device sample 150.

Figure 5:
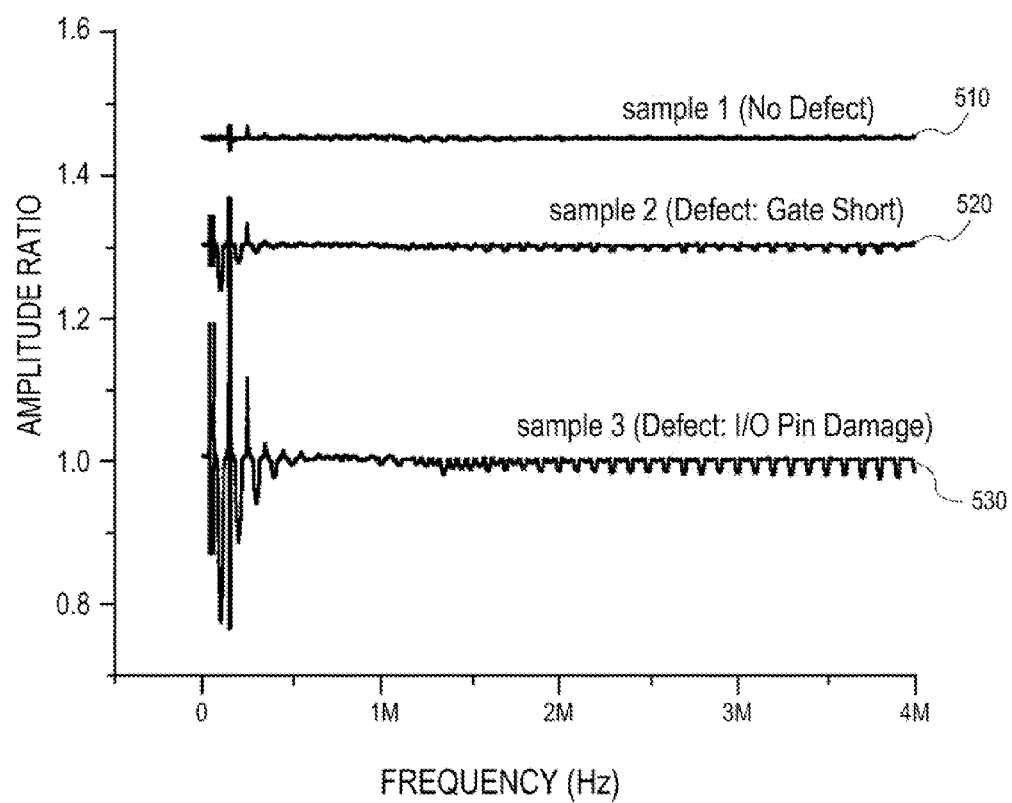
FIG. 5 illustrates examples of three PSA signatures.

FIG. 5 is an example of PSA signatures 510, 520 and 530 of three different samples of a device. PSA signature 510 is associated with a device sample 1 with no defects. PSA signature 520 is associated with a device sample 2 with a short-circuit defect in gate oxide. PSA signature 530 is associated with a device sample 3 with I/O pin damage. The PSA signatures 510, 520 and 530 are generated by dividing the amplitudes of power spectra of device sample 1, device sample 2 and device sample 3 by the amplitude of a known reference sample that has no defect. The resulting amplitudes of the PSA signatures are shown in log scale. A different amount of amplitude offset is added to each of PSA signatures 510 and 520 for ease of comparison of the three PSA signatures. It can be seen from FIG. 5 that PSA signatures 510, 520 and 530 are different from each other. Once a given device sample is identified as having the same distinct features (shape, peak location, amplitude, and the like) of one of PSA signatures 510, 520 and 530, it can be inferred that the device sample is likely to have the same electrical property (as well as defects, if any) as device sample 1, device sample 2, or device sample 3.

Figure 6:
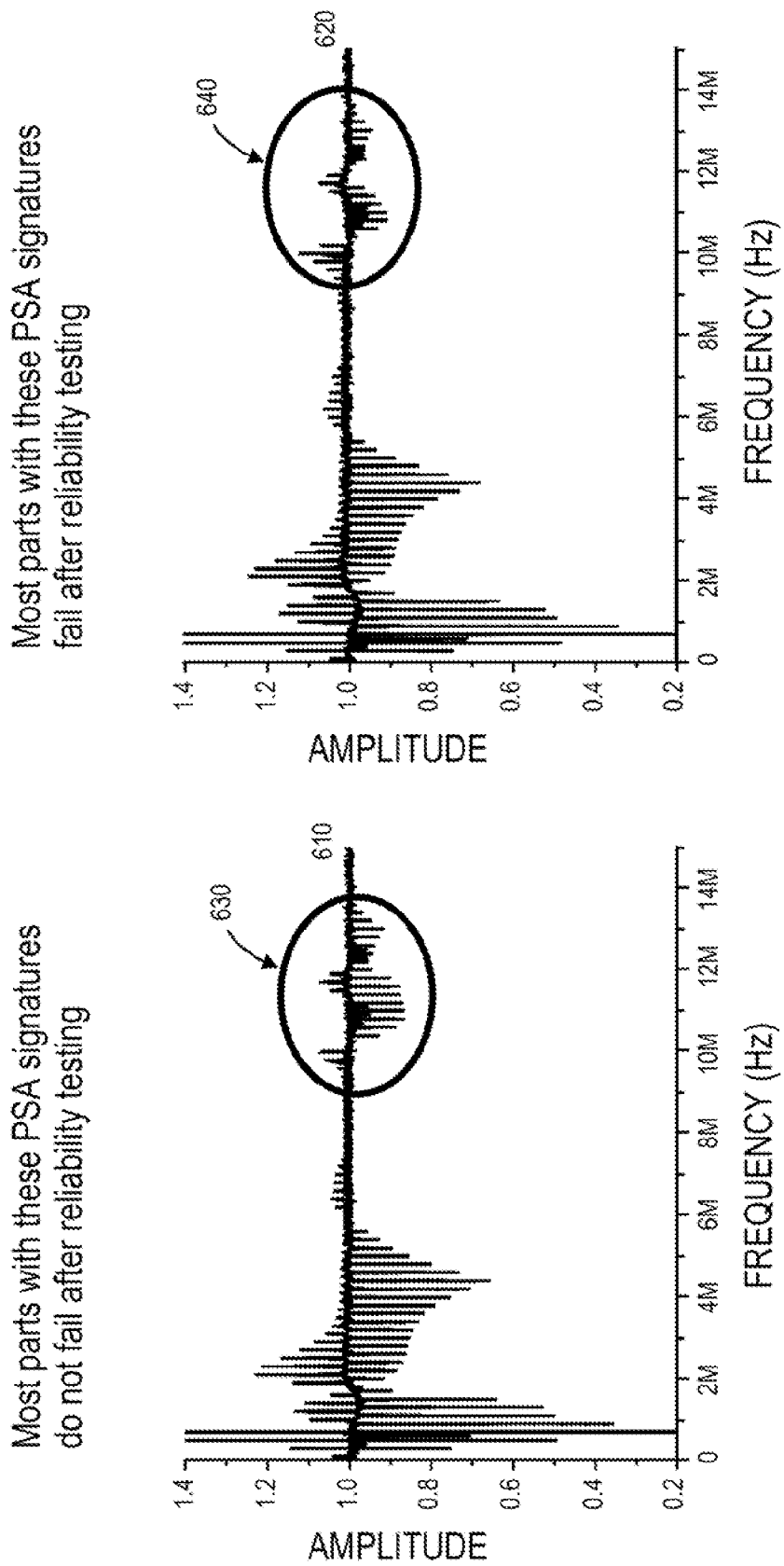
FIG. 6 illustrates an example of PSA signatures of a first device sample that has a latent defect and a second device sample that has no defects.

FIG. 6 is an example of PSA signatures 610 and 620 that are collected, respectively, from a first device sample that does not fail and a second device sample that fails in reliability testing. Initially, the first and second device samples are both functioning normally and correctly. PSA signatures 610 and 620 are measured before the reliability testing. The circled regions (regions 630 and 640) contain the portions of PSA signatures 610 and 620 that can be distinguished from each other. During the reliability testing, a series of high voltages, high temperatures, or a combination of both, are applied to the first and second device samples. In some embodiments, an energetic beam can be injected to the first and second device samples to accelerate the formation of defects that cause device failure. As a result of the reliability testing, the second device sample fails. That is, the second device sample is said to have a latent defect, which does not affect the normal function of the device until after a period of use in a stressed condition (e.g., high voltage and/or high temperatures). The second device sample can undergo further tests to identify the types of defects and the location of the defects. The corresponding PSA signature 620 is said to be a failure precursor, because its distinct features can be used as an early indication of a possible failure. That is, if a given device sample has a PSA signature similar to PSA signature 620, that given device sample is likely to fail in the same reliability testing. In some embodiments, a PSA signature can also be used to indicate mean-time-to-failure (MTTF) of a device sample. For example, if the second device sample fails after three hours into the reliability testing, another device sample having a PSA signature similar to PSA signature 620 is likely to fail at about the same time. Thus, the use of a PSA signature may replace or at least supplement some portion of reliability testing to cut down the testing and production cost.

Figure 7:
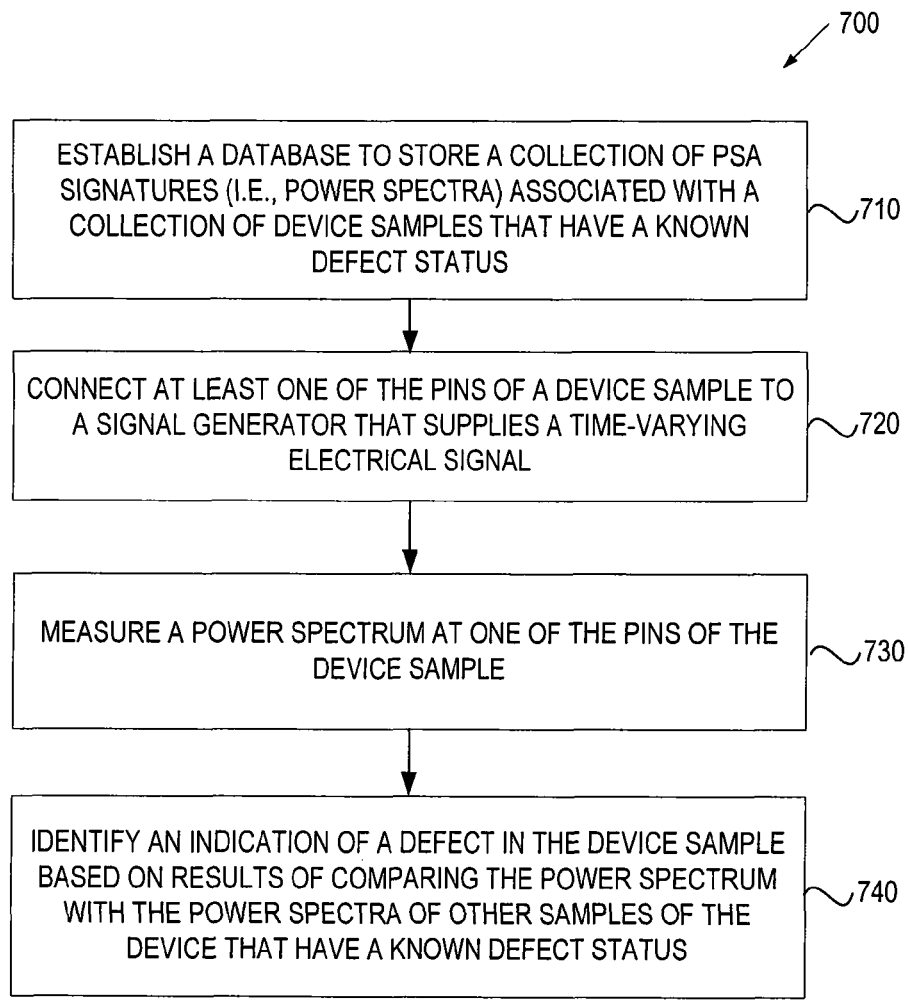
FIG. 7 is a flow diagram of one embodiment of a method of defect screening performed by a computer system.

FIG. 7 is a flow diagram of one embodiment of a method 700 for screening defects in devices such as integrated circuits. Method 700 may be implemented using different combinations of software, firmware, and/or hardware.

Referring to FIG. 7, in one embodiment, a database is established to store a collection of PSA signatures (i.e., power spectra) associated with a collection of device samples that have a known defect status (i.e., have no defects or have known defects) (block 710). In the embodiments of FIGS. 1 and 2, the database can be stored within computer system 175 or accessible by computer system 175 via a network. The database can be established by measuring the power spectrum of each device sample, subjecting each device sample to reliability testing and see whether it fails. If it fails, one or more known defect location(s) and/or determination techniques (such as LIVA and TIVA) can be used to localize the defect and/or to determine the type of defect. The PSA signature taken before the reliability testing can be stored in the database and associated with a defect status of the determined defect type. If the device sample does not fail, its PSA signature (taken before the reliability testing) can be stored in the database and associated with a defect status of no defects.

In one embodiment, a computer system (e.g., computer system 175 of FIGS. 1 and 2) receives a PSA signature (i.e., power spectrum) associated with a sample of a device. The sample has a number of pins, and at least one of the pins is coupled to a signal generator that supplies a time-varying electrical signal to the sample (block 720). In one embodiment, the sample of the device may be exposed to an energetic beam that is used to enhance PSA signatures. The PSA signature (i.e., power spectrum) of the sample is measured at one of the pins of the sample (block 730). The computer system 175 identifies an indication of a defect in the device sample based on results of comparing the power spectrum of the sample with one or more power spectra of the device that have a known defect status (block 740). The power spectra used in the comparison can be the power spectra stored in the database. The stored power spectra can be measured experimentally, generated based on theoretical modeling, or a combination of both. Thus, based on the result of the comparison, the computer system is able to determine whether a defect exists in the device sample, and, if a defect exists, identify the type of defect in the device sample.

It is understood that the techniques shown in the figures can be implemented using code and data stored and executed on one or more computer systems (e.g., a server, a workstation, a desktop, a laptop, or other computer systems). Such computer systems store and communicate (internally and/or with other computer systems over a network) code and data using non-transitory machine-readable or computer-readable media, such as non-transitory machine-readable or computer-readable storage media (e.g., magnetic disks; optical disks; random access memory; read only memory; flash memory devices; and phase-change memory). In addition, such computer systems typically include a set of one or more processors coupled to one or more other components, such as one or more storage devices, user input/output devices (e.g., a keyboard, a touch screen, and/or a display), and network connections. The coupling of the set of processors and other components is typically through one or more busses and bridges (also termed as bus controllers). The storage devices represent one or more non-transitory machine-readable or computer-readable storage media and non-transitory machine-readable or computer-readable communication media. Thus, the storage device of a given computer system typically stores code and/or data for execution on the set of one or more processors of that computer system.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of screening defects in a sample of a device, comprising:

supplying a time-varying electrical signal to the sample between a power pin and a ground pin of the sample, wherein the time-varying electrical signal is periodic and has a sine-wave, square-wave, or periodic chirp waveform;

measuring a power spectrum at a selected one of a plurality of pins of the sample wherein the measured power spectrum represents a response of the sample solely to said time-varying electrical signal and wherein, while measuring the power spectrum, each pin of the device other than the selected pin and the ground and power pins is floating or else biased at constant voltage; and identifying an indication of a defect in the sample based on results of comparing the power spectrum with one or more power spectra of the device that have a known defect status.

2. The method of claim 1, further comprising:
enhancing the indication of the defect by exposing the sample to an energetic beam.

3. The method of claim 2, wherein the energetic beam is a laser beam, X-ray beam, an electron beam, or an ion beam.

4. The method of claim 1, further comprising:
accelerating formation of defects in the sample by subjecting the sample to a reliability test until the sample fails;
storing the power spectrum of the sample taken before the reliability test as a failure precursor; and
using the failure precursor to identify device samples that are likely to fail in the reliability test.

5. The method of claim 1, wherein the indication comprises one or more of the following: a location of a peak, a shape of a frequency component, and an amplitude of the frequency component.

6. The method of claim 1, wherein the one or more power spectra of the device comprise a spectrum generated by theoretical modeling.

7. The method of claim 1, wherein the pin selected for measuring the power spectrum is the power pin.

8. A system for analyzing a sample of a device, comprising:
a signal generator configured to supply a time-varying electrical signal between a power pin of the sample and a ground pin of the sample, wherein the time-varying electrical signal is periodic and has a sine-wave, square-wave, or periodic chirp waveform;
a spectrum analyzer configured to measure a power spectrum at a selected one of a plurality of pins of the sample wherein the measured power spectrum represents a response of the sample solely to the time-varying electrical signal and wherein, while measuring the power spectrum, each pin of the device other than the selected pin and the ground and power pins is floating or else biased at constant voltage; and
a computer system to identify an indication of a defect in the sample based on results of comparing the power spectrum with one or more power spectra of the device that have a known defect status.

9. The system of claim 8, further comprising:
an energetic beam source to inject an energetic beam to the sample to thereby enhance the indication of the defect.

10. The system of claim 9, wherein the energetic beam is a laser beam, X-ray beam, an electron beam, or an ion beam.

11. The system of claim 8, wherein the one or more power spectra of the device comprise a spectrum generated by theoretical modeling.

12. The method of claim 8, wherein the spectrum analyzer is configured to measure the power spectrum at the power pin of the sample.

13. A method of screening a sample electronic device, comprising:
applying a periodic voltage signal between a power pin and a ground pin of the sample device;
measuring a power spectrum at a selected one of a plurality of pins of the sample device wherein the measured power spectrum represents a response of the sample solely to the applied periodic voltage, and wherein during the power spectrum measurement, each pin of the device other than the selected pin and the ground and power pins is floating, biased at constant voltage, or coupled through a load resistor to a constant voltage;
comparing the measured power spectrum to reference data, thereby to produce a comparison result; and
classifying the sample electronic device according to the comparison result.

14. The method of claim 13, wherein the periodic voltage has a sinusoidal, square-wave, or periodic chirp waveform.

15. The method of claim 13, wherein the periodic voltage is a sinusoid or square wave that toggles with full-rail amplitude.

16. The method of claim 13, wherein all pins of the device except for the selected pin and the power and ground pins are floating during the power spectrum measurement.

17. The method of claim 13, wherein all input pins of the device are biased at a constant voltage during the power spectrum measurement.

18. The method of claim 13, wherein the measured power spectrum is compared with one or more power spectra of a device or devices that have a known defect status, and wherein the classifying step comprises identifying a defect in the sample device based on the comparison.

* * * * *